United States Patent
Fukuda

(10) Patent No.: US 6,689,642 B2
(45) Date of Patent: Feb. 10, 2004

(54) SEMICONDUCTOR DEVICE AND MANUFACTURING METHOD THEREOF

(75) Inventor: Hirokazu Fukuda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 145 days.

(21) Appl. No.: 09/814,942

(22) Filed: Mar. 23, 2001

(65) Prior Publication Data

US 2001/0029063 A1 Oct. 11, 2001

(30) Foreign Application Priority Data

Mar. 24, 2000 (JP) .............................. 2000-083879

(51) Int. Cl.[7] .................. H01L 21/44; H01L 21/48; H01L 21/50
(52) U.S. Cl. .................. 438/122; 438/123; 438/124
(58) Field of Search .................. 438/122, 123, 438/124, FOR 367; 257/672

(56) References Cited

U.S. PATENT DOCUMENTS

| | | | | |
|---|---|---|---|---|
| 4,496,965 A | * | 1/1985 | Orcutt et al. | 257/666 |
| 4,801,765 A | * | 1/1989 | Moyer et al. | 174/52.4 |
| 5,643,835 A | * | 7/1997 | Chia et al. | 29/827 |
| 5,900,582 A | * | 5/1999 | Tomita et al. | 174/52.2 |
| 6,040,626 A | * | 3/2000 | Cheah et al. | 257/341 |
| 6,256,200 B1 | * | 7/2001 | Lam et al. | 361/704 |
| 6,307,755 B1 | * | 10/2001 | Williams et al. | 174/260 |

* cited by examiner

*Primary Examiner*—David E. Graybill
(74) *Attorney, Agent, or Firm*—Morrison & Foerster LLP

(57) ABSTRACT

Recently, there have been increasing demands for the reduction in size and weight of mobile computing/communication terminals as well as the elongation of the use time of the internal batteries. This invention alters the assembling structure of power MOSFET for reducing the on-state resistance and improving the production efficiency. This semiconductor device includes a lower frame having a header 2 for fixing a semiconductor chip and corresponding external leads 3*d*, 3*g*, a semiconductor chip fixed on the header, an upper frame 7 having a connection electrode 6 fixed on a current passage electrode 5 formed on the top face of the semiconductor chip 1 and the corresponding leads 3*s*, and a resin mold 8. This two-frame configuration provides extremely low on-state resistance and good production efficiency.

14 Claims, 10 Drawing Sheets

FIG.9

|  |  | frame | pre-form | connection configuration | electrode on the chip surface | R_DS(on), V_GS=4V (mΩ) | remarks |
|---|---|---|---|---|---|---|---|
| conventional | A | cupper | solder | Au wire:4 short wires | Al | 13.43 | 4 short wires (source side) |
| | B | cupper | solder | Au wire:conventional | Al | 12.10 | 2 long and 2 short wires (source side) |
| present invention | C | cupper | solder | Cu/solder | Aubump | 8.67 | wireless (reference of wireless configuration) |
| | D | cupper | silver paste | Cu/Ag paste | Aubump | 8.74 | effect of the Ag paste |

Material Characteristics (volume resistance coefficient $\rho$)

| frame (Cu) | $5.74 \times 10^{-6} \, \Omega \cdot cm$ |
|---|---|
| Au wire | $2.4 \times 10^{-6} \, \Omega \cdot cm$ |
| solder (Pb/5Sn/2.5Ag) | $1.95 \times 10^{-5} \, \Omega \cdot cm$ |
| Ag paste | $1.0 \times 10^{-4} \, \Omega \cdot cm$ |

PRIOR ART

PRIOR ART

SEMICONDUCTOR DEVICE AND MANUFACTURING METHOD THEREOF

FIELD OF THE INVENTION

The present invention relates to a semiconductor device and a manufacturing method thereof, especially to a semiconductor device having large electrodes on primary planes for letting large currents pass through, such as source and drain electrode of the power MOSFET, which will be termed as current passage electrodes hereinafter, and a manufacturing method for assembling the same semiconductor device.

BACKGROUND OF THE INVENTION

Recently, with the growth of the mobile computing/communication terminal market there has been an increasing demand for small and yet larger capacity lithium-ion batteries. The protecting circuit board for the management of charging and discharging the lithium-ion battery has to be small in order to meet the need for total weight reduction of the mobile computing/communication terminal and to withstand short circuits due to excessive loads. In this application, it was required that the protecting circuit board be small, as the board was housed inside the container of the lithium-ion battery. This size reduction has been accomplished by use of COB (Chip on Board) technology using multiple chip components. On the other hand, as the switching devices are connected to the lithium-ion battery in series, there was also a need for reducing the on-state resistance of the switching devices. This is an indispensable ingredient in mobile telephone applications for extending the calling period and the stand-by period.

For achieving a low on-state resistance ($R_{DS(on)}$), developments have been made for increasing the cell density by applying micro-fabrication technology to the chip manufacturing process. As a result, in a planar structure where the channels were formed on the surface of the semiconductor substrates, the cell density was 7.4 million per square inch and the on-state resistance was 27 mΩ. Further, in the first-generation trench structure where the channels were formed along the side of the trench, the cell density was 25 million per square inch and the on-state resistance was reduced to 17 mΩ. Improvements were made in the second-generation trench structure so that the cell density reached 72 million per square inch and the on-state resistance decreased to 12 mΩ. However, as there are limitations to this micro-fabrication technology, it is not likely that the on-state resistance can be to be significantly reduced further based on the same approach.

FIG. 11 is a cross-sectional view of a power MOSFET mounted on the conventional protecting circuit board described above. MOSFET bare chip 23 is fixed on a header 21 of a frame punched out from a copper material through a pre-form 22 made of a solder or a silver paste. A gold electrode (not shown in the figure) is formed as a drain electrode by sputtering on the bottom face of the power MOSFET bare chip 23, and a gate electrode and a source electrode are formed on the top face by evaporating aluminum. As shown as well in FIGS. 12 and 13, the drain terminals 25 of the frame and the header 21 are joined for making direct connection with the drain electrode. The gate terminal 26 and source terminal 27 are electrically connected to the gate electrode and source electrode, respectively, by ball bonding using a gold bonding wire 24. Thus, for reducing the on-state resistance of the power MOSFET, the electric resistances of the materials forming the frame, the pre-form, bonding wire 24 and the source electrode on the top face of the chip have to be taken into account.

FIG. 12 and FIG. 13 are plan views that depict conventional designs of the bonding wires used for reducing the on-state resistance.

The design shown in FIG. 12 is supposed to improve the electric current capacity by increasing to four the number of the bonding wires 24 which connect the source electrode and the source terminal 27. The design shown in FIG. 13 with two short and two long bonding wires connecting the source electrode and the source terminal 27 is supposed to improve the electric current capacity and, at the same time, to reduce the electrical resistance of the source electrode by expanding the region for the bonding.

FIG. 9 is a table that compares the on-state resistance depending on the assembling structure of the conventional power MOSFET with this invention. Both samples A and B are of a conventional SOP8 type mold structure, with sample A having the structure shown in FIG. 12 and sample B having the structure shown in FIG. 13. It is seen that changing the bonding wire configuration from a four short wire combination to a two short and two long wire combination reduced the on-state resistance from 13.43 mΩ to 12.10 mΩ, by 1.33 mΩ.

SUMMARY OF THE INVENTION

According to this invention, it is possible to achieve an on-state resistance low enough to meet the above demand by drastically altering the conventional assembling structure of the semiconductor devices including power MOSFET and by changing the manufacturing method thereof. This invention provides a means for the connection with the source electrode which serves as the most dominant current passage electrode on the top face of the semiconductor chip, in contrast to the conventional means where the connection is made through wire bonding and only one frame is used for other connections. This is realized by fixing an electrode integral with a lead on the electrodes including the current passage electrode, which will hereinafter be termed a "connection electrode."

Thus, the semiconductor device of this invention includes:

a lower frame having a header for fixing a semiconductor chip thereon and having external leads combined with the header as one unit;

a semiconductor chip fixed on the header;

an upper frame having a connection electrode fixed on a current passage electrode formed on the top face of the semiconductor chip and having external leads combined with the connection electrode as one unit; and a resin mold covering the header and a portion of the external leads of the lower frame, and covering the connection electrode and a portion of the external leads of the upper frame.

In this configuration, the semiconductor chip can be die-bonded onto the header, and the connection electrode can be large enough to cover most of the current passage electrode of the semiconductor chip when the connection electrode is fixed on the current passage electrode. This makes it possible to reduce the on-state resistance by as much as 30% in comparison with the conventional configuration where wire bonding is used for the connection between the current passage electrode and the corresponding leads.

Furthermore, this configuration provides a structure with extremely high heat dissipation, as the bottom face of the semiconductor chip is fixed on the header of the lower frame and the most of the top face of the semiconductor chip is connected to the connection electrode. Unlike the conventional connection using a gold bonding wire, the connection electrode can avoid melting and dissipate heat rapidly in the event of excessive current flow or short circuit due to excessive charge. Thus, this configuration provides an assembling structure for semiconductor devices with extremely high durability.

Still furthermore, as this configuration provides low enough on-state resistance as well as high enough heat dissipation, it is possible to make the size of the semiconductor chip even smaller, provided that the target specifications remain the same as the conventional ones. Thus, this invention makes it possible to meet the increasing demand for size reduction of the protecting circuit boards.

The method of manufacturing the semiconductor device of this invention includes:

preparing a lower frame having a header for fixing a semiconductor chip thereon and having external leads combined with the header as one unit;

fixing a semiconductor chip on the header;

preparing an upper frame having a connection electrode fixed on an electrode formed on the top face of the semiconductor chip and having external leads combined with the connection electrode as one unit;

positioning the lower frame and the upper frame and for fixing the connection electrode of the upper frame on a predetermined electrode of the semiconductor chip; and creating a mold with an insulating resin covering the header and a portion of the external leads of the lower frame, covering the connection electrode and a portion of the external leads of the upper frame, and covering the semiconductor chip.

In this manufacturing configuration, it is possible to assemble the upper and lower frames using a cost-effective punching-frame apparatus, as the connection electrode to be fixed on the current passage electrode on the top face of the semiconductor chip can be placed over the header connected to the bottom face of the semiconductor chip in this two-frame assembly method. This will increase the productivity of assembling the semiconductor chips for switching such as MOSFET and IGBT.

Furthermore, position-determining index holes formed at respective positions in the upper and the lower frames and guiding portions formed at the index holes of the lower frame can be used for positioning automatically both the connection electrode of the upper frame and the current passage electrode of the semiconductor chip. In this configuration, the assembly of the two frames can be treated as one frame assembly. It should be also mentioned that the efficiency of assembly can be improved as the process of bonding to the current passage electrode is dispensed with.

The wire bonding process can be dispensed with altogether using a configuration where the upper frame has another connection electrode to be fixed on another electrode of the semiconductor chips, such as gate electrode, and has another external lead extending to the frame which is combined with the connection electrode as one unit. Thus, this configuration will further improve efficiency of assembly.

Still furthermore, even though the semiconductor device of the present invention is composed of two frames, the semiconductor device can be assembled using the manufacturing lines designed for the device composed of one frame, and packaged into the same size as the package for the device composed of one frame.

BRIEF DESCRIPTION OF THE DRAWINGS

FIG. 8A is a plan view of an index hole for the positioning formed in the lower frame, FIG. 8B is a cross-sectional view along line Z—Z in FIG. 8A, and FIG. 8C is a plan view of an index hole for positioning formed in the upper frame.

FIG. 9 is table of relevant characteristics of the semiconductor devices based on this invention and conventional technology.

DETAILED DESCRIPTION OF THE INVENTION

Embodiments of this invention will be described in detail in reference to FIG. 1 through FIG. 10 hereinafter.

Figure 1:
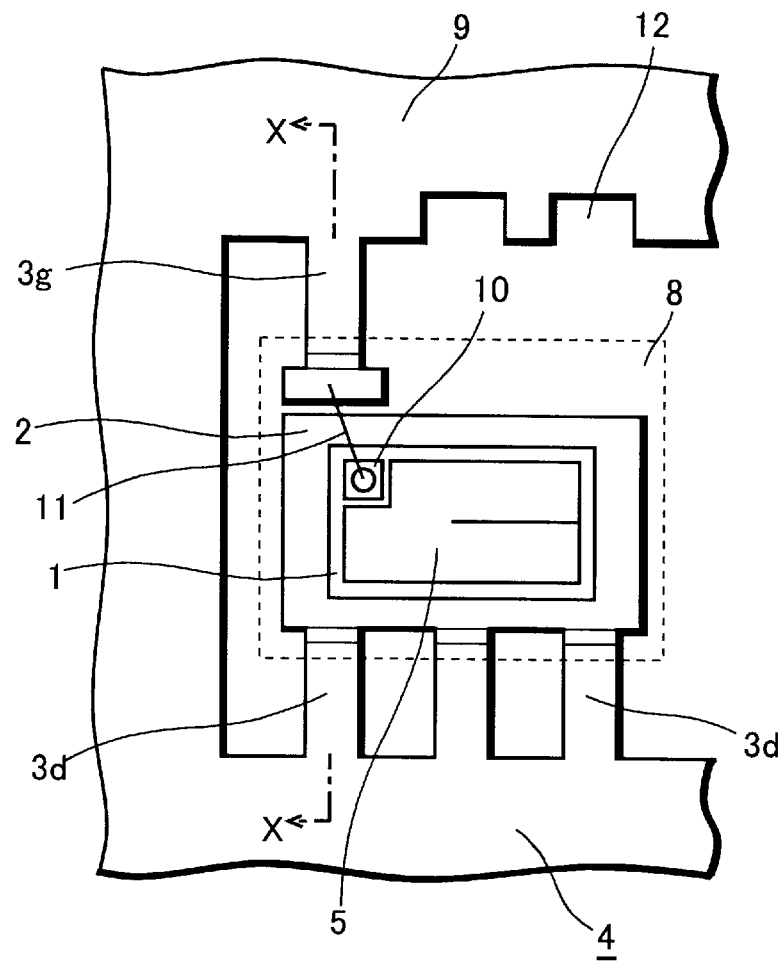
FIG. 1 depicts collectively a semiconductor device of this invention, with FIG. 1A being a plan view of the semiconductor device and FIG. 1B being a cross-sectional view along line X—X of FIG. 1A.
Figure 1:
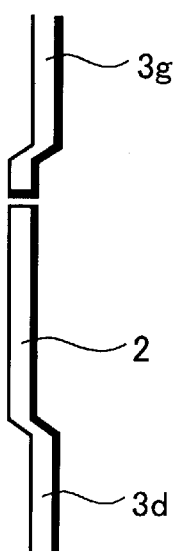
Figure 2:
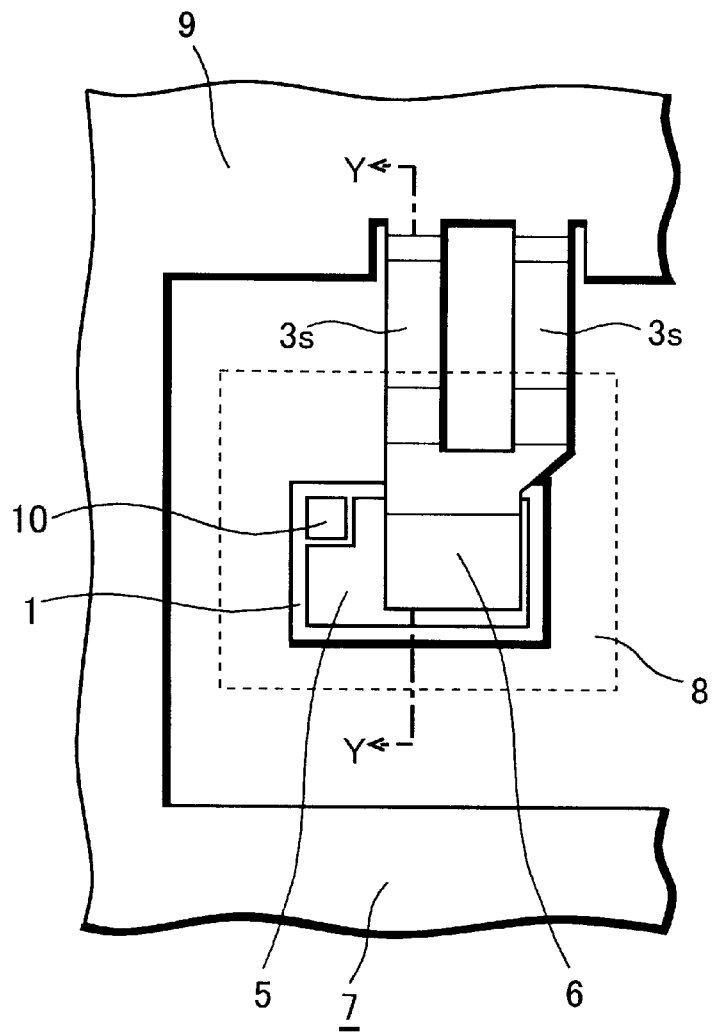
FIG. 2 depicts collectively a semiconductor device of this invention, with FIG. 2A being a plan view of the semiconductor device and FIG. 2B being a cross-sectional view along line Y—Y of FIG. 2A.
Figure 2:
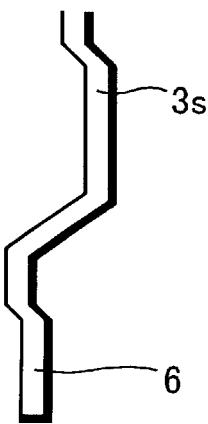

FIG. 1 and FIG. 2 show an assembling structure of a semiconductor device of this invention. The semiconductor device of this invention includes:

a lower frame 4 having a header 2 for fixing a semiconductor chip 1 thereon and having external leads 3d combined with the header 2 as one unit;

a semiconductor chip 1 fixed on the header 2;

an upper frame 7 having a connection electrode 6 fixed on a current passage electrode 5 formed on the top face of the semiconductor chip 1 and having external leads 3s combined with the connection electrode 6 as one unit; and a resin mold 8 covering the header 2 and a portion of the external leads 3d of the lower frame 4 and covering the connection electrode 6 and a portion of the external leads 3s of the upper frame 7.

FIG. 1A shows the arrangement of the lower frame 4 and the semiconductor chip 1, and FIG. 1B is a cross-sectional view along line X—X of FIG. 1A of the lower frame 4. The lower frame 4 itself is punched out from a copper material. As shown in FIG. 1A, the lower frame 4 includes a header 2 located in the center of the lower frame 4, three external leads 3d combined with the header 2 as one unit and extending from the header 2 to the outer frame 9, and an external lead 3g for another electrode 10 with one end being close to the header 2 and another end being connected to the outer frame 9. As seen from the cross-sectional view of FIG. 1B, the header 2 and the free end of the external lead 3g for another electrode 10 are lifted a little above the external leads 3d and other portion of the external lead 3g. This is to approximately level all three surfaces of the external leads 3d, 3g, and 3s.

The small controlling electrode and the current passage electrode 5 occupy most of the surface area of the top face of semiconductor chip 1. The bottom face also has a current passage electrode (not shown in the figure) covering the entire surface area. The semiconductor chip 1 used can be a power MOSFET as an insulated gate type semiconductor device or an IGBT (Insulated Gate Bipolar Transistor), which is a composite device combining a power MOSFET and transistors.

A gold electrode is formed as a drain electrode (not shown in the figure) by sputtering on the bottom face of the power MOSFET. An aluminum/titanium/nickel/(gold or silver) thin film is evaporated onto the top face of the device to form the gate electrode 10 and source electrode 5. The drain electrode and source electrode serve as the current passage electrodes 5, while the gate electrode 10 serves as a controlling electrode for controlling the switching on and off of the channel. Thus, most of the surface area of the top face of the semiconductor chip 1 is occupied by the source electrode 5 and only a small area at the corner is saved for the gate electrode 10. A bare chip power MOSFET 1 is fixed on a predetermined position within the header 2 of the lower frame 4 using a pre-form material made of solder or silver paste. The gate electrode 10 is electrically connected to the external lead 3g, which later becomes a gate terminal, by ball bonding using gold bonding wires 11.

FIG. 2A shows the arrangement of the upper frame 7 and the semiconductor chip 1, and FIG. 2B is a cross-sectional view along line Y—Y of FIG. 2A of the upper frame 7. As it is the case with the lower frame 4, the upper frame is punched out from a copper material. The upper frame 7 includes the connection electrode 6 that is to be fixed on the current passage electrode 5, such as the source electrode, formed on the top face of the semiconductor chip 1 and the external leads 3s combined with the connection electrode 5 as one unit.

It is desirable that the connection electrode 6 have the same shape as the source electrode or the current passage electrode 5 and cover almost all the surface area of the source electrode. However, the surface area covered by the connection electrode 6 may be decided taking positioning accuracy into consideration. Two external leads 3s extend from the connection electrode 6 and reach the outer frame 9. The external leads 3s are configured not to contact the four external leads 3d, 3g of the lower frame 4 or the bonding wires 11. At the completion of the manufacturing process, the semiconductor device of this invention will take the form of a SOP6 package.

The cross-sectional view of the upper frame is shown in FIG. 2B. The external leads 3s extending from the connection electrode 6 first bend upwardly, then bend downwardly so that the portion extruding from the resin mold 8 level with the four external leads 3d, 3g of the lower frame 4, and bend upwardly again by the thickness of the lower frame 4 at the portion overlapping with the outer frame 9 of the lower frame 4. Accordingly, cuts 12 are made in the lower frame 4 at the locations where the external leads 3s of the upper frame 7 extend level with other leads. By bending the external leads 3s upwardly next to the connection electrode 6, it is possible to avoid a short circuit between the semiconductor chip 1 and the external leads 3s.

The connection electrode 6 is then fixed on the source electrode 5 using a pre-form material made of solder or silver paste, with the connection electrode 6 covering the most of the surface area of the source electrode 5. The adhesion between the two electrodes improves as the connection electrode 6 is pressed against the source electrode 5 by the spring function of the external leads 3s.

As shown by the dotted lines in FIG. 1A and FIG. 1B, the resin mold 8 covers the header 2 and a portion of the external leads 3d, 3g of the lower frame 4, and the connection electrode 6 and a portion of the external leads 3s of the upper frame 7. The finished semiconductor device of this embodiment has six external leads 3d, 3g, 3c extruding from the resin mold 8 and can be considered as a device composed of one frame.

FIG. 9 shows the measured on-state resistances of samples C and D of this embodiment. By comparing the measured on-state resistance of sample C to the measured on-state resistance of sample B of the conventional assembling structure, it is seen that the on-state resistance decreases by 3.43 mΩ by replacing the gold bonding wires with the connection electrode 6 of the upper frame 7. As the gold bonding wire has an electric resistance of 2.3 mΩ and the connection electrode 6 of the upper frame 7 has an electric resistance of 0.2 mΩ, the reduction due to the change in the connection means to the source electrode 5 is 2.1 mΩ. Thus, it is estimated that the reduction obtained by eliminating the electric resistance within the aluminum electrode thin film on the surface of the semiconductor chip is 1.33 mΩ.

Comparing samples C and D, the difference of the on-state resistance between the semiconductor device made with solder pre-form fixing the connection electrode 6 of the upper frame 7 and the device made with silver paste pre-form is merely 0.07 mΩ, and is not reflected in the difference in material characteristics of the pre-form materials. This is because the pre-form material is extremely thin in comparison to its surface area.

Now, embodiments of the method of manufacturing a semiconductor device of this invention will be described with reference to FIG. 1 through FIG. 10.

The method of manufacturing a semiconductor device of this invention includes:

preparing a lower frame 4 having a header 2 for fixing a semiconductor chip 1 thereon and having external leads 3d combined with the header 2 as one unit;

fixing a semiconductor chip 1 on the header 2;

preparing an upper frame 7 having a connection electrode 6 fixed on a current passage electrode 5 formed on the top face of the semiconductor chip 1 and having external leads 3s combined with the connection electrode 6 as one unit;

positioning the lower frame 4 and the upper frame 7 and for fixing the connection electrode 6 of the upper frame 7 on the current passage electrode 5 of the semiconductor chip 1; and creating a mold with an insulating resin 8 covering the header 2 and a portion of the external leads 3d, 3g of the lower frame 4, covering the connection electrode 6 and a portion of the external leads 3s of the upper frame 7, thereby covering the semiconductor chip 1.

Figure 7:
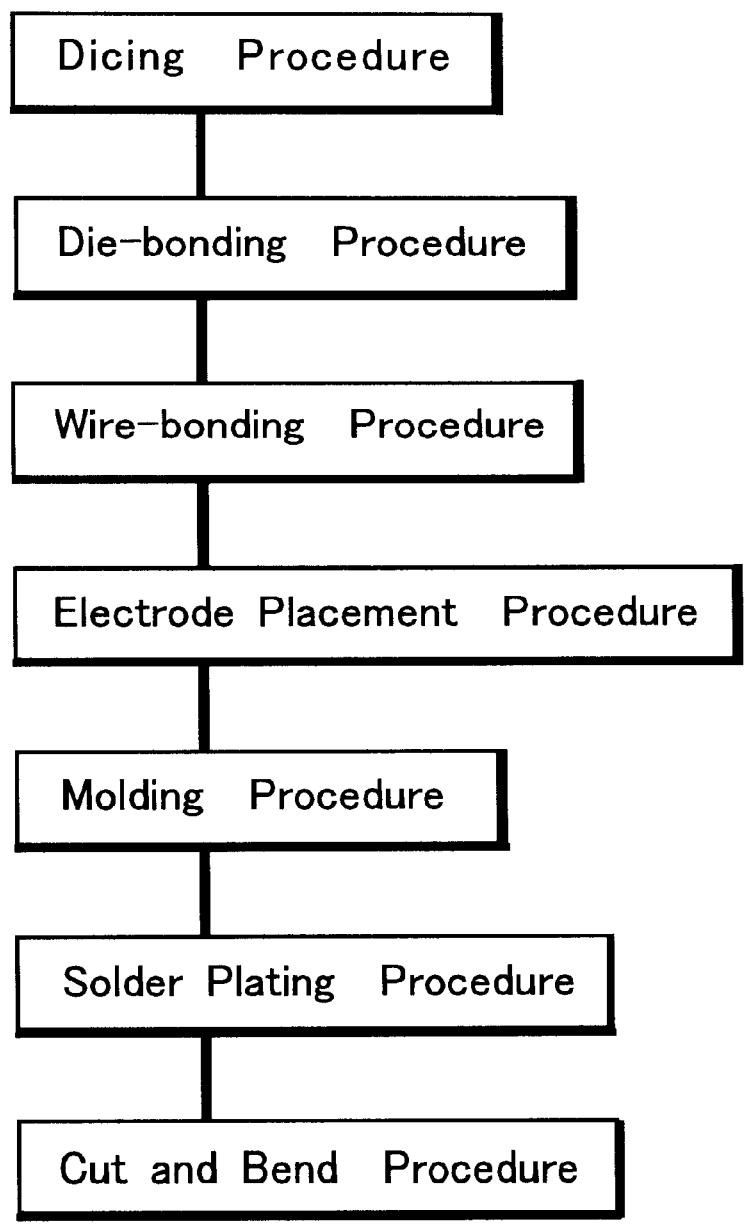
FIG. 7 shows the process flow of a manufacturing method of this invention.
Figure 8:
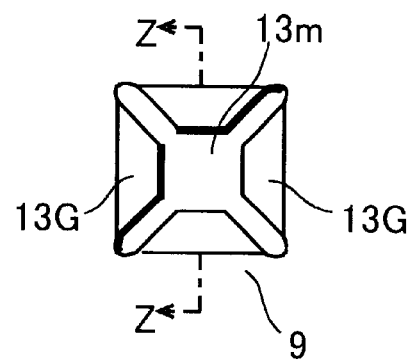
FIG. 8 depicts collectively a positioning procedure for a manufacturing method of this invention.
Figure 8:
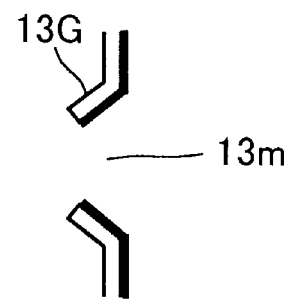
Figure 8:
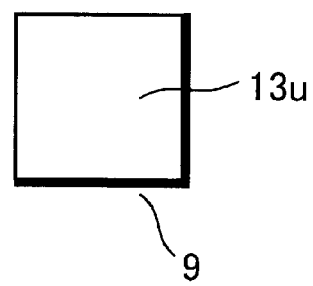

FIG. 7 shows a process flow of the manufacturing method of this embodiment. It includes from upstream to downstream, a dicing procedure, a die bonding procedure, a wire bonding procedure, an electrode placement procedure, a molding procedure, a solder plating procedure, and a cut and bend procedure.

In the dicing procedure, a semiconductor wafer (not shown in the figure) having a large number of power MOSFET as the insulating gate type semiconductor component, or IGBTs, as the composite device of a combination of power MOSFETs and transistors, is cut by a dicing saw along the scribing lines into individual semiconductor chips 1. At this point, the current passage electrode 5 occupying most of the surface area of the semiconductor chip 1 and the small controlling electrode 10 are already formed on the top face of the semiconductor chip 1. The whole bottom face of the semiconductor chip 1 is also covered by the current passage electrode. In the case of the power MOSFET, a gold electrode is formed by sputtering on the bottom face as a drain electrode (not shown in the figure). An aluminum/titanium/nickel/(gold or silver) thin film is evaporated onto the top face to form the gate electrode 10 and source electrode 5. The drain electrode and source electrode 5 serve as the current passage electrodes while the gate electrode 10 serves as a controlling electrode for controlling on and off of the channel.

In the die bonding procedure, the semiconductor chip 1 is fixed on the header 2 of the lower frame 4.

Figure 3:
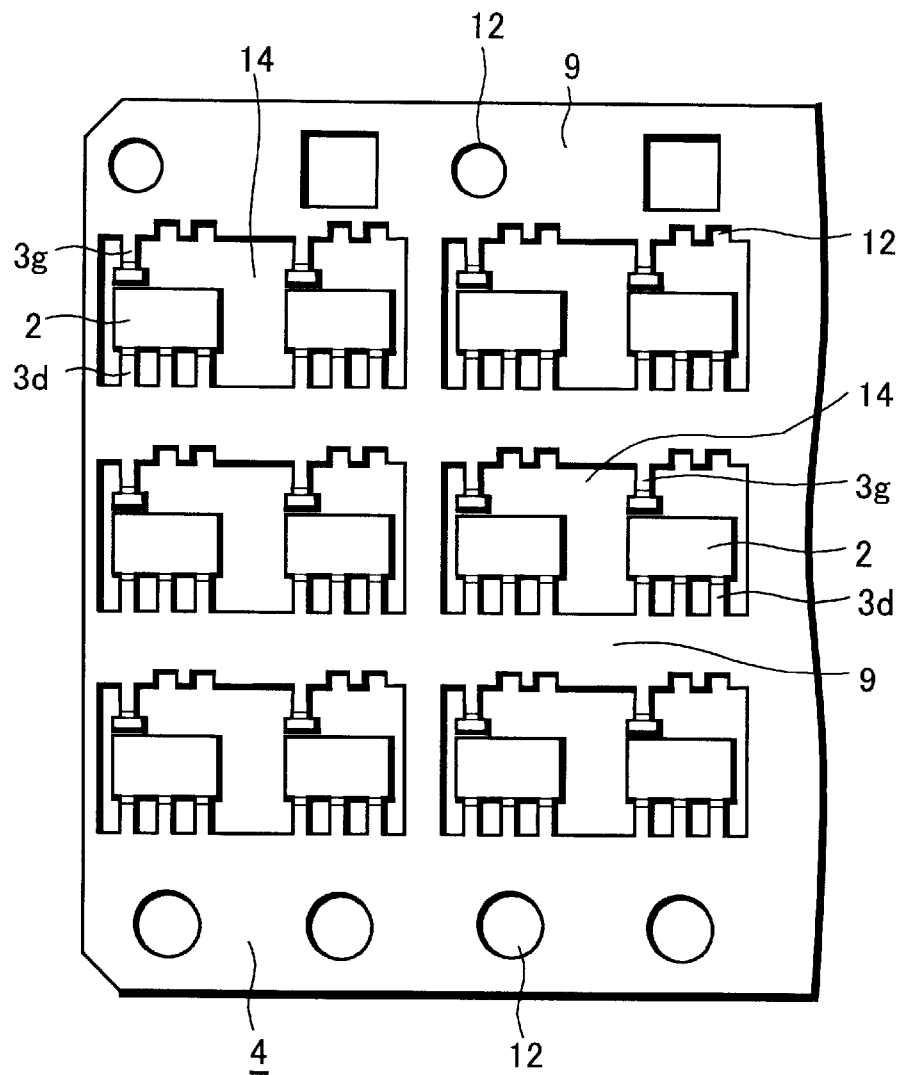
FIG. 3 is a plan view showing a lower frame of a semiconductor device of this invention.
Figure 4:
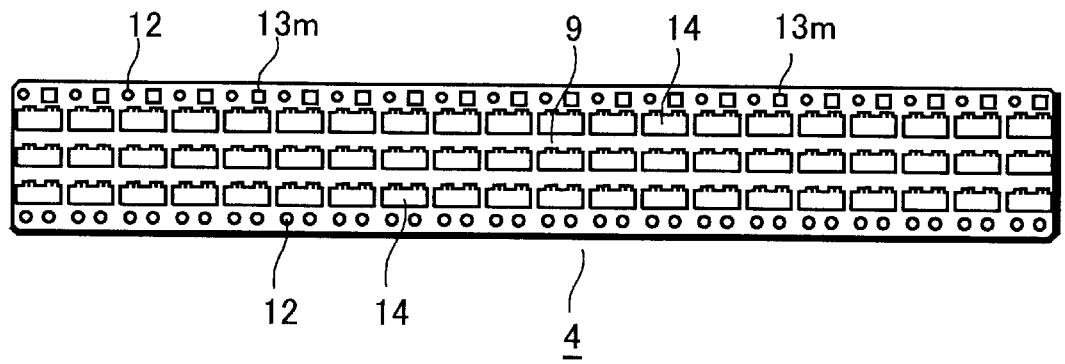
FIG. 4 is a plan view showing one whole lower frame of a semiconductor device of this invention.

FIG. 3 and FIG. 4 are the plan views showing the whole lower frame structure 4. The lower frame itself is punched out from a copper material. As seen from the lead pattern shown in FIG. 1, the lower frame 4 includes a header 2 located in the center of the lower frame 4, three external leads 3d combined with the header 2 as one unit and extending from the header 2 to the outer frame 9, and an external lead 3g for another electrode 10 with one end being close to the header 2 and another end being connected to the outer frame 9. As seen from the cross-sectional view of FIG. 1B, the header 2 and the free end of the external lead 3g for another electrode 10 are lifted a little above the external leads 3d and other portion of the external lead 3g.

As seen from FIG. 3, round index holes 12 are formed at both side edges of the outer frame 9 of the lower frame 4 with a constant interval for each side. These index holes are used for the positioning and the pitch-by-pitch transportation in the procedures of the manufacturing method. A square position-determining index hole 13m (shown in FIG. 4) for positioning the upper and lower frames 4, 7 is formed next to each round index hole 12 along the top side edge of the outer frame 9 of the lower frame. The round index holes 12 are formed at the locations corresponding to the lines connecting the centers of the headers 2 with a constant interval along the bottom side edge of the outer frame 9 of the lower frame 4. Two headers 2 and the corresponding external leads 3d are formed in one cell area 14 surrounded by the outer frame 9.

It is also seen from FIG. 4 that the lower frame 4 has a 3×20 matrix of cell areas 14 between the top and bottom rows of index holes 12. Thus, one lower frame 4 has 60 cell areas and 120 headers 2 for fixing the semiconductor chips 1. In FIG. 4, the headers 2 and the external leads 3d are omitted from the cell areas 14.

The semiconductor chips 1 are then fixed on each of the headers 2 in the cell areas 14 of the lower frame 4 by die bonding. That is, the semiconductor chips 1, such as power MOSFET bare chips, are fixed on the headers 2 of the lower frame 4 through the pre-form made of solder or silver paste using a die bonding instrument. During this procedure, the index holes 12 in the top and bottom side edges are used for the positioning of the headers 2 and for transporting the lower frame 4 by one pitch at a time. At the end, all the headers 2 of the lower frame 4 have a semiconductor chip fixed on themselves.

In a procedure with a solder used as a preform, molten solder is applied on the header 2 by melting a solder wire, then, the semiconductor chip 1 is placed on the header 2 and cooled down for completing the fixing. In the procedure with a silver paste used as a pre-form, a viscous silver paste is applied on the header 2, then, the semiconductor chip 1 is temporarily fixed on the header 2 and later heated in a non-oxidation atmosphere for curing of the paste and completing the fixing.

In the wire bonding procedure, another electrode 10, such as the gate electrode, of the semiconductor chip 1 is bonded to the corresponding external lead 3g with a metal wire 11. Another electrodes 10 including the gate electrodes are electrically connected by ball bonding with gold bonding wires using a bonding instrument with automatic recognition. During this procedure, the index holes 12 in the top and bottom side edges are also used for the positioning of the headers 2 and for transporting the lower frame 4 by one pitch at a time. Thus, all of another electrodes 10 including the gate electrodes of the semiconductor chip 1 of the lower frame 4 are automatically bonded to the corresponding external leads 3g.

Another embodiment where all the wire-bonding processes are eliminated will be described later with reference to FIG. 10.

The electrode placement procedure includes preparing an upper frame 7 having a connection electrode 6 to be fixed on a current passage electrode 5 formed on the top face of the semiconductor chip 1 and having external leads 3s combined with the connection electrode 6 as one unit, and positioning the lower frame 4 and the upper frame 7 and for fixing the connection electrode 6 of the upper frame 7 on the current passage electrode 5 of the semiconductor chip 1.

Figure 5:
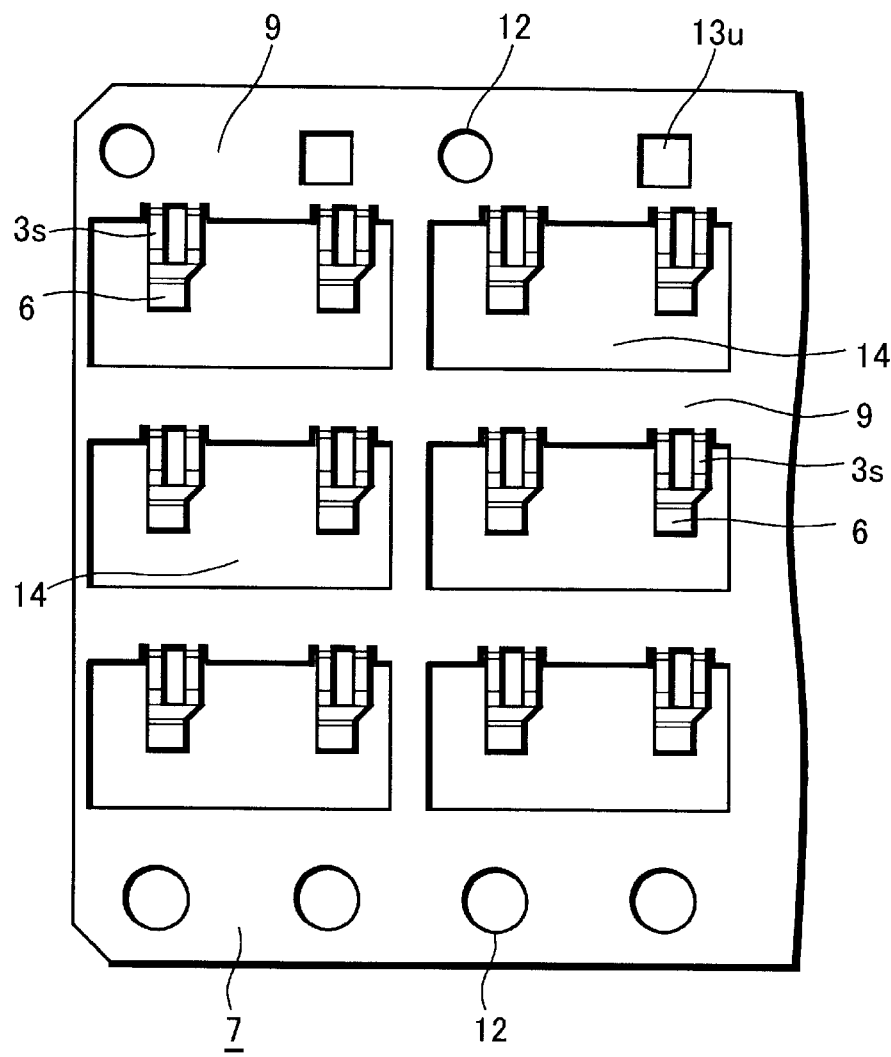
FIG. 5 is a plan view showing an upper frame of a semiconductor device of this invention.
Figure 6:
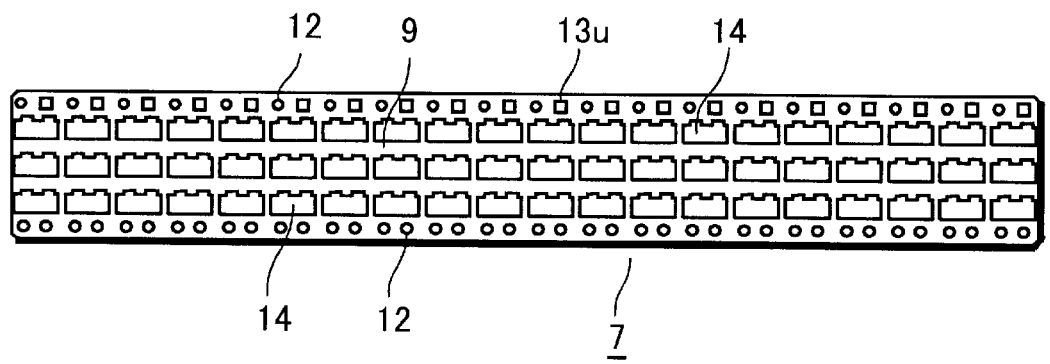
FIG. 6 is a plan view showing one whole upper frame of a semiconductor device of this invention.

FIG. 5 and FIG. 6 are plan views showing the whole upper frame structure 7. The upper frame 7 itself is punched out from a copper material. As seen from the lead pattern shown in FIG. 2, the upper frame 7 includes the connection electrode 6 to be fixed on the current passage electrode 5, such as the source electrode, formed on the top face of the semiconductor chip 1 and the external leads 3s combined with the connection electrode 5 as one unit.

It is desirable that the connection electrode 6 have the same shape as the source electrode, or the current passage electrode 5, and cover almost all the surface area of the source electrode. However, the surface area covered by the connection electrode 6 may be decided taking positioning accuracy into consideration. Two external leads 3s extend from the connection electrode 6 and reach the outer frame 9. The external leads 3s are configured not to contact the four external leads 3d, 3g of the lower frame 4 or the bonding wires 11. At the completion of the manufacturing process, the semiconductor device of the present invention will take the form of a SOP6 configuration.

The cross-sectional view of the upper frame is shown in FIG. 2B. The external leads 3s extending from the connection electrode 6, first bend upwardly, then bend downwardly so that the portion protruding from the resin mold 8 level with the four external leads 3d, 3g of the lower frame 4, and bend upwardly again by the thickness of the lower frame 4 at the portion overlapping with the outer frame 9 of the lower frame 4. Accordingly, cuts 12 are made in the lower frame 4 at the locations where the external leads 3s of the upper frame 7 extend leveling with other leads. By bending the external leads 3s upwardly next to the connection electrode 6, it is possible to avoid the short circuit between the semiconductor chip 1 and the external leads 3s.

As seen from FIG. 6, round index holes 12 are also formed at both side edges of the outer frame 9 of the upper frame 7 with a constant interval for each side, as in the case with the lower frame 4. These index holes are used for the positioning and the pitch-by-pitch transportation in the manufacturing method. A square position-determining index hole 13u for positioning the upper and lower frames 4, 7 is formed next to each round index hole 12 along the top side edge of the outer frame 9 of the upper frame 7. The two position-determining index holes 13m, 13u have an identical size and shape. The role of the two position-determining index holes in the positioning procedure will be described in detail later in this description of the manufacturing method. Two connection electrodes 6 and the corresponding external leads 3s are formed in one cell area 14 surrounded by the outer frame 9.

It is also seen from FIG. 6 that the upper frame 7 also has a 3×20 matrix of cell areas 14 between the top and bottom rows of index holes 12 in accordance with the alignment in the lower frame 4. Thus, one upper frame 7 has 60 cell areas and 120 connection electrodes 6. In FIG. 6, the connection electrodes 6 and the external leads 3s are omitted from the cell areas 14.

Then, the lower frame 4 and the upper frame 7 are brought to a proper position for the assembling. That is, the upper frame 4 is put over the lower frame 7 so that the two position-determining index holes 13m, 13u coincide.

FIG. 8A and 8B are plan and side views, respectively, of the position-determining index hole 13m formed in the lower frame 4. The position-determining index hole 13m in the lower frame 4 has four guiding portions 13G bent upward at the four edges of the square hole. For the positioning of the upper and lower frames 4, 7, the guiding portions 13G are inserted into the position-determining index holes 13u of the upper frame 7, which is shown in FIG. 8C and has the same size and shape as the position-determining index holes 13m of the lower frame 4. The height of the guiding portion 13G is designed to be small enough to prevent malfunctions during the pitch-by-pitch transportation of the lower frame 4 in the manufacturing procedures such as die bonding and wire bonding.

Furthermore, guiding pins (not shown in the figure) as separate parts from the frames can be used for positioning the upper and lower frames 4, 7, replacing the guiding portions 13G. That is, the guiding pins are inserted into the round index hole 12 of the two frames or the square position-determining index holes 13m, 13u which have, in this case, exactly same shape and size, for positioning the upper and lower frames 4, 7. Since this configuration is free from the guiding portion 13G, there will not be any malfunctions due to the guiding portion 13G during the pitch-by-pitch transportation of the lower frame 4 in the manufacturing procedures such as die bonding and wire bonding.

After the positioning procedure, the connection electrodes 6 of the upper frame 7 are located right above the current passage electrodes 5 including the source electrode, and are fixed on the current passage electrodes 5 through the pre-form made of solder or silver paste. The adhesion between the two electrodes improves as the connection electrode 6 is pressed against the current passage electrode 5 by the spring function of the external leads 3s. Other processing conditions are similar to those of the die bonding procedure.

In the molding procedure, the insulating resin 8, such as epoxy resin, covers the header 2 and a portion of the external leads 3d, 3g of the lower frame 4, the connection electrode 6 and a portion of the external leads 3s of the upper frame 7, and the semiconductor chip 1, using the transfer molding technique. The area covered by the insulating resin mold 8, as described above, is shown by the dotted lines in FIG. 1 and FIG. 2. The finished semiconductor device of this embodiment has six external leads 3d, 3g, 3c extruding from the resin mold 8 and can be considered as a device composed of one frame, taking the form of a SOP6 package.

In the solder plating procedure, the external leads 3d, 3g, 3s extruding from the resin mold 8 are coated with solder metals such as tin using the solder plating, in preparation for mounting on a circuit board.

In the cut and bend procedure, the individual semiconductor devices are separated by cutting the external leads 3d, 3g, 3s of the two frames 4, 7 from the outer frames 9 of the two frames 4, 7, by using cutting metal dies. Later, if needed, the external leads 3d, 3g, 3s extruding from the resin mold 8 are pressed into predetermined shapes.

Figure 10:
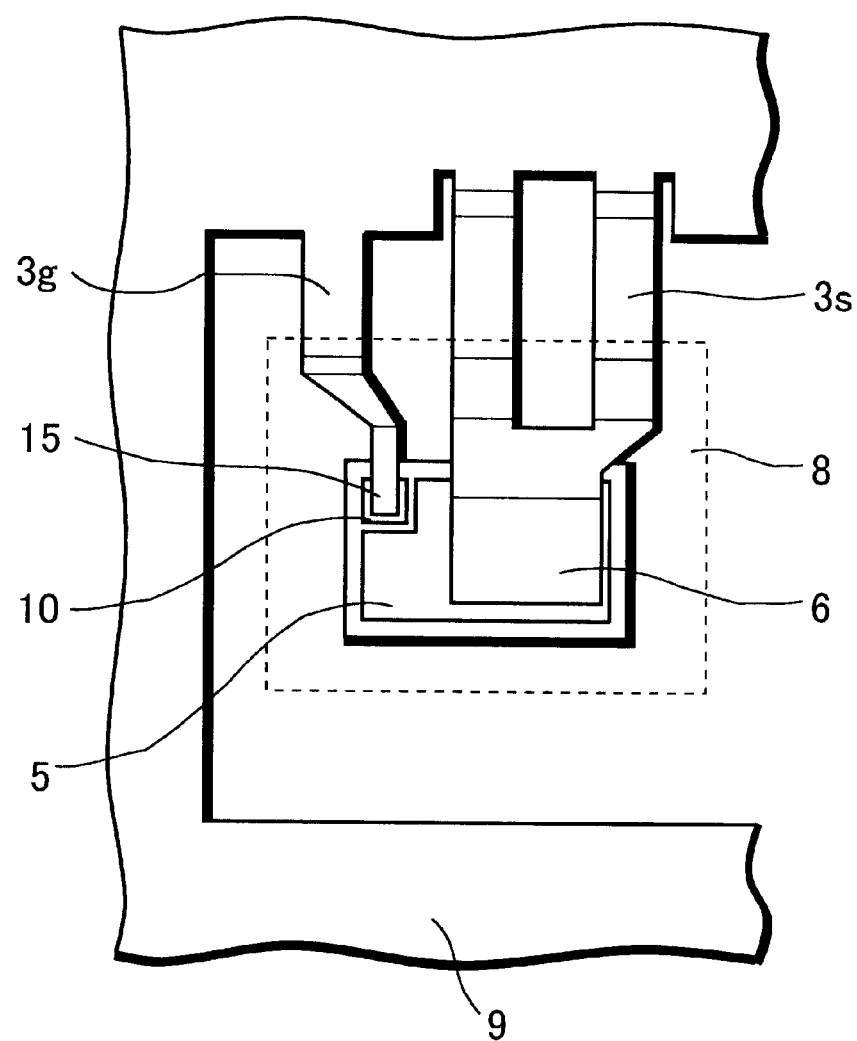
FIG. 10 is a plan view of another embodiment of this invention.
Figure 11:
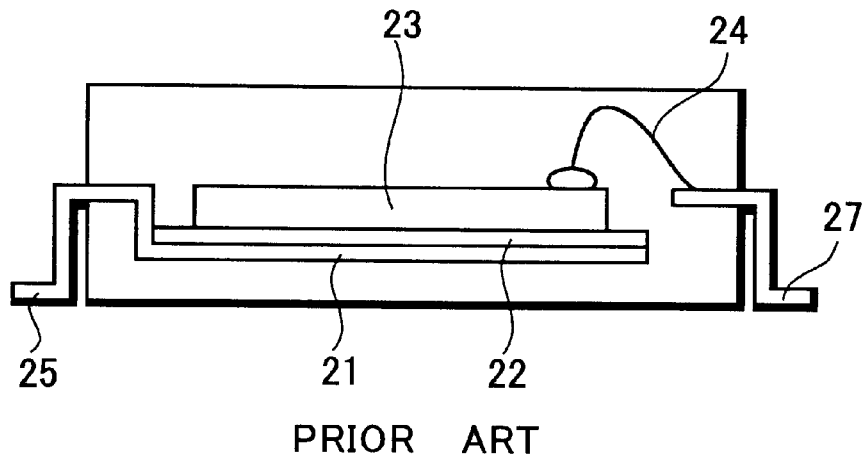
FIG. 11 depicts an assembling structure of a conventional power switching MOSFET device.
Figure 12:
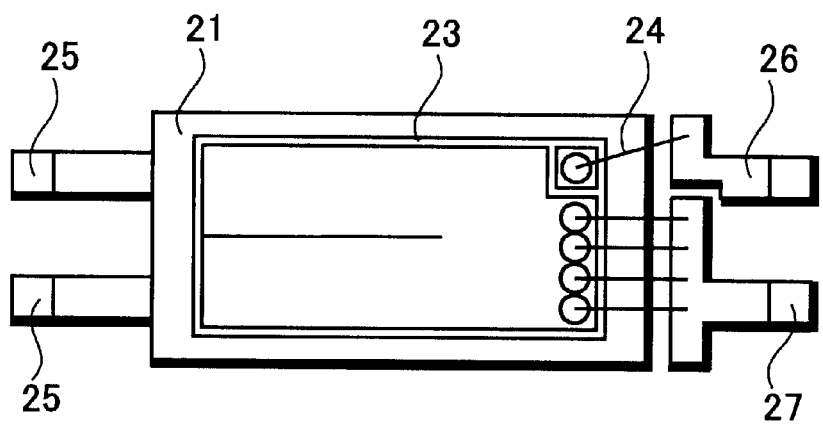
FIG. 12 depicts an assembling structure of a conventional switching device.
Figure 13:
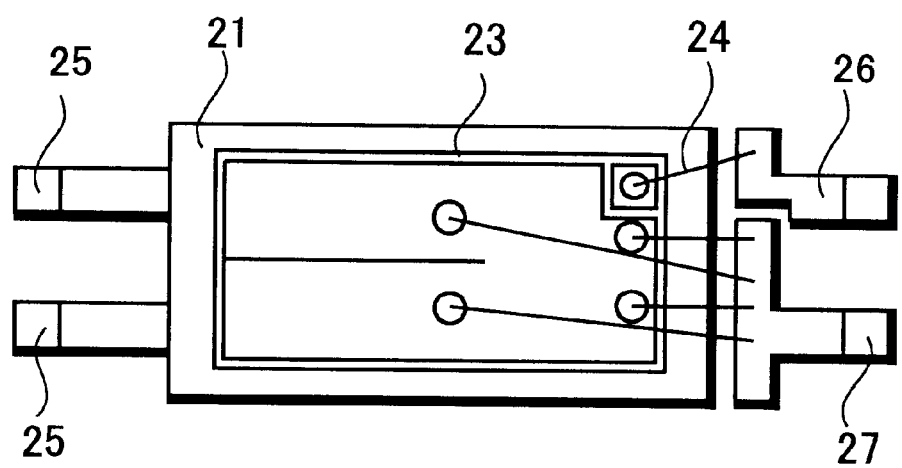
FIG. 13 depicts another assembling structure of a conventional switching device.

Another embodiment of the method of manufacturing a semiconductor device of this invention is shown in FIG. 10. In this embodiment, the wire bonding is completely eliminated from the manufacturing process. In this configuration, the upper frame 7 has another connection electrode 15 that is to be fixed on another electrode 10, such as a gate electrode, of the semiconductor chips 1, and has another external lead 3g extending to the frame which is combined with the connection electrode as one unit. The gate connection electrode 15 is fixed, together with the fixing of the connection electrode, on the gate electrode 10 using the pre-form during the electrode placement procedure. Because of the need for a larger gate electrode 10 than the gate electrode 10 used with the wire bonding technique due to the accuracy of the positioning, in this embodiment the surface area of the current passage electrode 5 becomes smaller, resulting in an on-state resistance that is higher by a small amount. However, this manufacturing method of a semiconductor device has a significant advantage in that the total manufacturing process is shortened by eliminating all the wire bonding processes.

Furthermore, this invention is not confined to the SOP6 type package, and can also be applied to a SOP8 package and the configuration where two semiconductor chips are housed inside one package.

From the invention thus described based on the embodiments, it will be obvious that the invention is not confined to the described embodiments, and that the invention may be varied in many ways. Such variations are not to be regarded as a departure from the spirit and the scope of the invention, and all such modifications are intended for inclusion within the scope of the following claims.

What is claimed is:

1. A method of manufacturing a semiconductor device, comprising:

preparing a lower frame having a header for fixing a semiconductor chip thereon and having external leads combined with said header as one unit, the header and the corresponding external leads being located in a first cell area that is completely encircled by the lower frame;

fixing a semiconductor chip on said header;

preparing an upper frame having a connection electrode for being fixed on a current passage electrode formed on the top face of said semiconductor chip and having external leads combined with said connection electrode as one unit, the connection electrode and the corresponding external electrodes being located in a second cell area that is completely encircled by the upper frame a portion of the upper frame being disposed lower than the connection electrode;

positioning said lower frame and said upper frame so that the portion of the upper frame disposed lower than the connection electrode contacts a portion of the lower frame;

fixing said connection electrode of said upper frame on said current passage electrode of said semiconductor chip; and creating a mold with an insulating resin covering said header and a portion of said external leads of said lower frame, covering said connection electrode and a portion of said external leads of said upper frame, and covering said semiconductor chip.

2. A method of manufacturing a semiconductor device according to claim 1, wherein said positioning of said lower frame and said upper frame is performed by inserting protruding portions made from surrounding portion of holes formed as indices in said lower frame into index holes in said upper frame.

3. A method of manufacturing a semiconductor device according to claim 1, wherein an external lead for another electrode of said semiconductor chip is formed close to said header in the first cell area of said lower frame.

4. A method of manufacturing a semiconductor device according to claim 3, wherein said another electrode of said semiconductor chip and said corresponding external lead are wire-bonded with metal wires after fixing said semiconductor chip on said header.

5. A method of manufacturing a semiconductor device according to claim 1, wherein in parallel with said connection electrode and said external leads combined with said connection electrode as one unit are formed in said upper frame another connection electrode for another electrode of said semiconductor chip and another external lead combined with said another connection electrode as one unit.

6. A method of manufacturing a semiconductor device according to claim 5, wherein said another connection electrode of said upper frame is fixed on said another electrode of said semiconductor device at the same time as said connection electrode is fixed on said current passage electrode of said semiconductor chip.

7. A method of manufacturing a semiconductor device according to claim 1, 2, 3, 4, 5, or 6, wherein said semiconductor chip comprises insulated gate type semiconductor components.

8. A method of manufacturing a semiconductor device according to claim 1, 2, 3, 4, 5, or 6, wherein said semiconductor chip is a MOSFET or IGBT.

9. A method of manufacturing a semiconductor device according to claim 1, 2, 3, 4, 5, or 6, wherein said header and said external leads of said lower frame are formed from a single frame material.

10. A method of manufacturing a semiconductor device according to claim 1, 2, 3, 4, 5, or 6, wherein said connection electrode and said external leads of said upper frame are formed from a single frame material.

11. A method of manufacturing a semiconductor device, comprising:

preparing a lower frame having a first lower side rail and a second lower side rail and having a plurality of first cell areas formed between the first and second lower side rails in the lower frame, each of the first cell areas having a header for fixing a semiconductor chip thereon and having external leads combined with said header as one unit;

fixing a semiconductor chip on each of said headers;

preparing an upper frame having a first upper side rail and a second upper side rail and having a plurality of second cell areas formed between the first and second upper side rails in the upper frame, each of the second cell areas having a connection electrode for being fixed on a current passage electrode formed on the top face of the corresponding semiconductor chip and having external leads combined with said connection electrode as one unit, the first and second upper side rails being disposed lower than the connection electrodes;

positioning said lower frame and said upper frame so that the first and second lower side rails and the first and second upper side rails are matched and in contact, respectively;

fixing each of the connection electrodes of said upper frame on the current passage electrode of the corresponding semiconductor chip; and creating a mold with an insulating resin for each of the semiconductor chips, each of the molds covering the corresponding header and a portion of the corresponding external leads of said lower frame, covering the corresponding connection electrode and a portion of the corresponding external leads of said upper frame, and covering the corresponding semiconductor chip.

12. A method of manufacturing a semiconductor device according to claim 11, wherein the positioning of the lower and upper frames uses a plurality of index holes formed in one of the first and second lower side rails and the first and second upper side rails.

13. A method of manufacturing a semiconductor device according to claim 1 or 11, further comprising positioning a portion of the external leads of the upper frame at a same level as a portion of the corresponding external leads of the lower frame by extending the external leads of the upper frame through cuts made in the lower frame.

14. A method of manufacturing a semiconductor device according to claim 1 or 11, wherein each pair of the corresponding first and second cell areas accommodates more than one semiconductor chip.

* * * * *